United States Patent [19]
Marshall et al.

[11] Patent Number: 5,691,940
[45] Date of Patent: Nov. 25, 1997

[54] METHOD AND APPARATUS FOR PROGRAMMABLE CURRENT LIMITS

[75] Inventors: Andrew Marshall; Kenneth G. Buss; Ross E. Teggatz; Joe A. Devore, all of Dallas, Tex.

[73] Assignee: Texas Instruments Incorporated, Dallas, Tex.

[21] Appl. No.: 656,553

[22] Filed: May 31, 1996

Related U.S. Application Data

[63] Continuation of Ser. No. 187,368, Jan. 26, 1994, abandoned, which is a continuation of Ser. No. 966,780, Oct. 27, 1992, abandoned.

[51] Int. Cl.⁶ ......................................... G11C 11/34
[52] U.S. Cl. ........................... 365/185.24; 365/185.18
[58] Field of Search ............................. 365/226, 227, 365/185.22, 185.24, 185.18; 307/270

[56] References Cited

U.S. PATENT DOCUMENTS

| | | | |
|---|---|---|---|
| 4,533,845 | 8/1985 | Bynum et al. | 307/540 |
| 4,645,956 | 2/1987 | Shuey | 307/562 |
| 4,977,333 | 12/1990 | Suzuki et al. | 307/243 |
| 5,021,682 | 6/1991 | Hobrecht | 307/296.8 |
| 5,107,685 | 4/1992 | Kobayashi | 62/115 |
| 5,185,538 | 2/1993 | Kondoh et al. | 307/270 |
| 5,192,881 | 3/1993 | Marten | 307/468 |
| 5,209,076 | 5/1993 | Kauffman et al. | 62/126 |
| 5,303,198 | 4/1994 | Adachi et al. | 365/185.24 |
| 5,347,214 | 9/1994 | Haussecker | 324/158 MG |
| 5,390,019 | 2/1995 | Fritze et al. | 356/350 |
| 5,557,570 | 9/1996 | Iwahashi | 365/185.24 |
| 5,579,274 | 11/1996 | Buskirk et al. | 365/185.24 |

*Primary Examiner*—William L. Sikes
*Assistant Examiner*—Tcep H. Nguyen
*Attorney, Agent, or Firm*—W. James Brady III; Richard L. Donaldson

[57] ABSTRACT

A method and apparatus for programmable current limits is provided in which a plurality of current limit programmable cells (44 and 46) are programmed with a current limit. Output circuitry (14 and 16) which outputs current is limited by current limit circuitry (20, 24, 38, 40, and 42) when the output current reaches the programmed current limit.

8 Claims, 2 Drawing Sheets

FIG. 1

| OUTPUT 1 | OUTPUT 2 | OUTPUT 3 |
| OUTPUT 4 | OUTPUT 5 | OUTPUT 6 |

2.00A ---- CURRENT LIMIT FOR NORMAL LOAD 3 AND GENERAL PURPOSE CURRENT LIMIT 1.50A ---- CURRENT LIMIT FOR NORMAL LOAD 2

1.30A —— NORMAL LOAD 3 →

1.00A —— NORMAL LOAD 2 →

0.75A ---- CURRENT LIMIT FOR NORMAL LOAD 1

0.50A —— NORMAL LOAD 1 →

FIG. 3

METHOD AND APPARATUS FOR PROGRAMMABLE CURRENT LIMITS

This application is a Continuation of application Ser. No. 08/187,368, filed Jan. 26, 1994, now abandoned, which is a continuation of application Ser. No. 07/966,780, filed Oct. 27, 1992, now abandoned.

TECHNICAL FIELD OF THE INVENTION

This invention relates generally to electronic circuits, and more particularly to a method and apparatus for programmable current limits.

BACKGROUND OF THE INVENTION

Power integrated circuits often contain several distinct output circuits. When the loads driven by these output circuits experience faults, such as short circuit conditions, significant power losses, and even component failures within the output circuits result. To limit this power dissipation, and to prevent component failures, most output circuits include current limiting circuitry to prevent the output current from rising above a predetermined current.

Because different loads are driven by different output circuits, different normal load currents frequently exist for each distinct output circuit. In existing systems, however, the short circuit current limits for all of the output circuits are set to the same level typically one-and-a-half to three times the highest normal load current experienced by any output circuit. Consequently, the current limits for the output circuits having lower normal load currents are higher than they need to be, resulting in excessive power dissipation during short circuit conditions.

Existing schemes for adjusting current limits include Zener trim and poly-silicon fuse techniques. Such schemes have significant limitations, since they do not allow for re-programming, and are difficult to program.

Therefore, a need has arisen for a method and apparatus for programmable current limits for output circuits, to allow for minimization of power loss depending on the particular load driven by that output circuit.

SUMMARY OF THE INVENTION

In accordance with the teachings of the present invention, a method and apparatus for programmable current limits is provided which substantially eliminates or reduces disadvantages and problems associated with prior art systems. In particular, a method and apparatus for limiting current is provided in which a plurality of current limit programmable cells are programmed with a current limit. Output circuitry which outputs current is coupled to the current limit programmable cells and to current limit circuitry. The current limit circuitry limits the output current when that output current reaches the programmable current limit. In a particular embodiment, the programmable cells are electrically erasable programmable read only memory cells.

In particular embodiment, the current limit circuitry includes current control circuitry coupled to the current limit programmable cells. The current control circuitry is operable to generate a first reference voltage based on the current limit stored in the current limit programmable cells. The output circuitry is operable to generate a second reference voltage based on the output current, and the current limit circuitry limits the output current when the first and second references voltages are substantially equal.

In still another embodiment, a method and apparatus for reducing power dissipation during current limit situations is provided by switch-mode-operation of the output, in which EEPROM programmable cells are programmed to provide a duty-cycle mode.

An important technical advantage of the present invention is the fact that power dissipation can be minimized by programming current limits for each output circuit depending on the particular needs of that output circuit. This important technical advantage allows for flexibility in configuration or current limits for varying applications.

BRIEF DESCRIPTION OF THE DRAWINGS

For a more complete understanding of the present invention and the advantages thereof, reference is now made to the following description taken in conjunction with the accompanying drawings in which like reference numbers indicate like figures and wherein:

FIG. 1 illustrates a typical layout configuration of a multiple output power integrated circuit;

FIG. 2 illustrates a graph of normal operating load currents, non-optimized short circuit current limits and optimized short circuit current limits;

FIG. 3 illustrates a circuit schematic of a current limiting circuit constructed according to the teachings of the present invention;

DETAILED DESCRIPTION OF THE INVENTION

Figure 4:
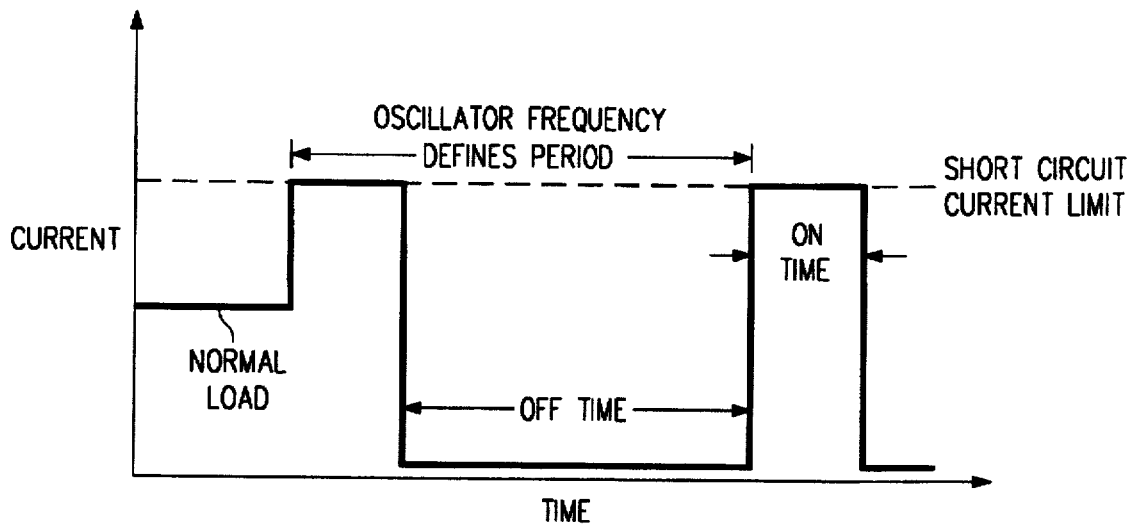
FIG. 4 illustrates a timing and current diagram for a switching scheme for short circuit power dissipation reduction.

The preferred embodiments of the present invention are illustrated in FIGS. 1–5 of the drawings, like numerals being used to refer to like and corresponding parts of the various drawings.

FIG. 1 illustrates a typical layout configuration of an integrated circuit 10 having several discrete power output circuits. FIG. 1 illustrates a power integrated circuit having six outputs, it being understood that more or less output circuits may be included without departing from the intended scope herein. FIG. 2 is a graph illustrating normal load operating currents, optimized short circuit current limits, and a general purpose short circuit current limit. It should be understood that the particular current levels used in FIG. 2 are for example only, and other currents can be used without departing from the intended scope of the present invention.

As shown in FIG. 2, the normal load for two of the output devices, referenced as normal load 1 is 0.5 amps. The optimized short circuit current limit for these outputs are represented by the dashed line, and are approximately 0.75 amps. The normal load current for another two output devices, referred to as normal load 2, are shown at approximately 1.0 amps with their optimized short circuit current limit set at approximately 1.5 amps. Finally, the load for two other output circuits, referred to as normal load 3, are shown at approximately 1.3 amps, and their optimized short circuit current limit is shown at approximately 2 amps.

In typical existing circuits, the short circuit limit for each of these circuits would not be the optimized short circuit limits shown in FIG. 1, but rather would be set at 2 amps.

Significant power savings are realized by optimizing the current limit for each output circuit. For example, if all six of the outputs shown in FIG. 1 were short circuited to 12 volts, and each had a 2 amp short circuit current limit, a total of 144 watts would be dissipated. With optimized current limiting at 1.5 times normal operating current and two 1.3 amp loads, two 1 amp loads, and two 500 miliamp loads, as shown in FIG. 2, only 101 watts would be dissipated if all outputs were short circuited to 12 volts.

FIG. 3 illustrates a schematic circuit diagram of a particular embodiment of an output circuit 12 with current limit according to the present invention. As shown in FIG. 3, the output is taken from the drains of transistors 14 and 16. The source of transistor 14 is coupled to ground, and the source of transistor 16 is coupled to node 17 which is coupled to ground through a resistor 18. The gates of transistors 14 and 16 are coupled to the drain of a transistor 20. The drain of transistor 20 is also coupled to an AND-Gate 23 through a resistor 22. The output of AND-Gate 23 provides power to the output circuit drivers. The input to AND-Gate 23 are Vcc and the output from a switching circuit 49, to be discussed. It should be understood that AND-Gate 23 could be omitted, coupling resistor 22 directly to ground. In normal operation, the output of AND-Gate 23 is high. The source of transistor 20 is coupled to ground.

A comparator 24 is coupled to the gate of transistor 20. The comparator 24 is also coupled to two current sources 26 and 28. Furthermore, the comparator is coupled to node 17 and node 30.

Current source 31 and transistors 32, 34, and 36 form a current mirror 37 and supply current to current control transistors 38 and 40. Transistors 38 and 40 are also coupled to node 30 as shown in FIG. 3. Node 30 is coupled to ground through a resistor 42. The gates of transistors 38 and 40 are coupled to electrically erasable programmable read only memory (EEPROM) cells 44 and 46, respectively.

In operation, comparator 24 operates to compare the voltages appearing at nodes 17 and 30. The voltage at node 17 is based on the output current, since transistor 16 is used to sense the output current. When the voltages at nodes 17 and 30 are equal, transistor 20 is turned on thereby reducing the voltage on the gates of transistors 16 and 14, thus limiting the output current. Therefore, by controlling the voltage at node 30, the current limit can be adjusted. This voltage is adjusted by controlling the current flowing through current control transistors 38 and 40. The more current that flows through these transistors, the higher the voltage at node 30 will be, since node 30 is coupled to ground through resistor 42. Current will flow through transistor 38 and 40 depending on the voltage at their respective gates. The current that flows through transistors 38 and 40 comes from the current mirror 37.

The gates of transistors 38 and 40 are coupled to EEPROM cells 44 and 46. The output of these EEPROM cells 44 and 46 will be either high or low. Thus, depending upon the state of these EEPROM cells, the gates of transistors 38 and 40 will be either high or low. In this way, transistors 38 and 40 are either switched on or off, and the voltage at node 30 thereby controlled. The use of EEPROM cells has several advantages such as their reprogrammability and their ease of programming.

It should be understood that only two transistors, transistors 38 and 40, and their respective EEPROM cells, 44 and 46, have been shown for clarity. More current control transistors may be used to more finely control the voltage appearing at node 30. The dots appearing between current control transistors 38 and 40 and EEPROM cells 44 and 46 are intended to illustrate that additional transistors and EEPROM cells may be used in this fashion. Likewise, more current mirrors could be used to supply these additional current control transistors.

As is shown in FIG. 3, EEPROM cells 44 and 46 are programmed through a program pin on the integrated circuit. This programming can occur by placing voltage on a particular pin of the IC thereby beginning the programming mode. Furthermore, the outputs of EEPROM cells 44 and 46 are coupled to test logic 47 to allow testing to ensure that the programming was performed as desired. A transistor 48 is also included as part of the current mirror 37 to provide a minimum voltage at node 30. This gives an offset to the comparator 24 so that a minimum value over current condition is always pre-programmed.

The MOS and bipolar transistors shown in FIG. 3 are shown with conventional notation. It should be understood that a particular embodiment is illustrated, and that other transistors or circuit components may be used without departing from the intended scope of the present invention.

FIG. 4 illustrates a timing and current diagram for a switching scheme for short circuit dissipation reduction. As is shown, upon reaching a short circuit current limit, the output circuit is shut off after a given period of time at the short circuit limit. After another given period of time, the output circuit is turned back on. If the short circuit condition no longer exists, the current will rise to the normal load and operation will continue as normal. If however the short circuit condition persists, and the short circuit limit is reached again, the cycle will continue with the output circuit at the short circuit limit for a particular duration of time followed by complete shut-off of the circuit for a predetermined period of time. As can be seen from the FIG. 4, power dissipation is reduced by completely turning off the output circuit, rather than having it remain at the short circuit current limit.

Figure 5:
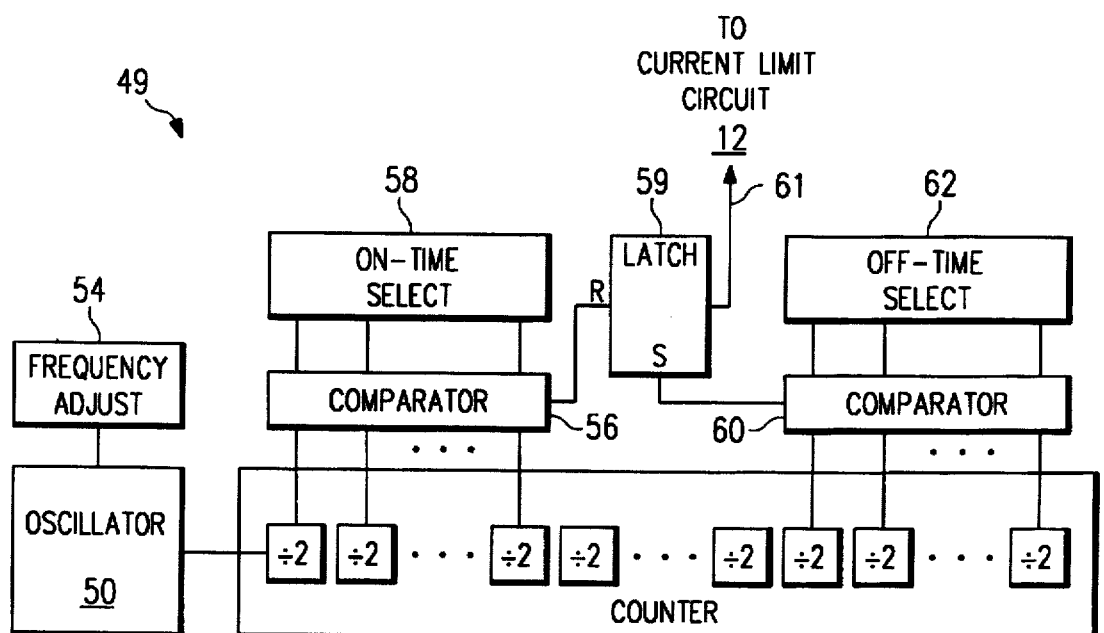
FIG. 5 illustrates a schematic diagram of a circuit constructed according to the teachings of the present invention for a switching scheme for short circuit power dissipation reduction.

FIG. 5 illustrates a block diagram of a programmable switching circuit 49 for implementing the switching scheme shown in FIG. 4. As is shown, an oscillator 50 is coupled to a counter 52. The amount of time that the output circuit remains at the short circuit limit, and the amount of time that the output circuit is off are derived from the oscillator 50. The frequency of oscillator 50 can be programmed by coupling the oscillator circuit to a EEPROM frequency adjust circuit 54 comprised of a plurality of EEPROM cells. Counter 52 is also coupled to comparators 56 and 60.

Once a current limit has been reached, counter 52 is reset and begins counting. Comparator 64 has a first input coupled to the gates of transistors 14 and 16 and a second input coupled to a reference voltage indicative of the current limit. Comparator 64 provides an output on line 65 to reset counter 52 when the output current, as indicated by the voltage at the gates of transistors 14 and 16, reaches the current limit, as indicated by the reference voltage Vref. A predetermined number of the lower order bits of counter 52 are coupled to comparator 56. Comparator 56 compares the bits received from these low order bits of counter 52 with those programmed in an EEPROM on-time select circuit 58 comprised of a plurality of EEPROM cells. If these are equal, then the predetermined period for which the current limit condition is allowed to persist has been met, and comparator 56 will reset a latch 59 causing output node 61 to turn off power to the output circuit, by switching off AND-Gate 23 shown in FIG. 3. Likewise, some predetermined number of higher order bits of counter 52 are coupled to comparator 60. Comparator 60 is coupled to a EEPROM off-time select circuit 62 comprised of a plurality of EEPROM cells. When the bits from these predetermined number of higher order bits of counter 52 equal those programmed in EEPROM off-time select circuit 62, comparator 60 will set latch 59 causing node 61 to be placed at a high potential. AND-Gate 23 will thus switch on, turning the output circuit back on since the other input to AND-Gate 23 is coupled to Vcc. It should be understood that this other AND-Gate 23 input could be coupled to other circuits.

In summary, programmable current limits and programmable on-off times for over current conditions are provided by the present invention. By these circuits and methods, users have flexibility in minimizing power losses due to short circuit conditions.

Although the present invention has been described in detail it should be understood that various changes, substitutions, and alterations can be made without departing from the spirit and scope of the invention as defined solely by the appended claims.

What is claimed is:

1. A current limiting circuit, comprising:

a plurality of current limit programmable cells operable to be programmed with a current limit, said programmable cells comprising electrically erasable programmable read only memory cells;

output circuitry operable to output current; and current limit circuitry coupled to said current limit programmable cells and said output circuitry, said current limit circuitry operable to limit said output current when said output current reaches said current limit; wherein:

said current limit circuitry includes current control circuitry coupled to said current limit programmable cells, said current control circuitry operable to generate a first reference voltage based on said current limit stored in said current limit programmable cells;

said output circuitry is operable to generate a second reference voltage based on the output current; and said current limit circuitry is operable to limit said output current when said first and second reference voltages are substantially equal.

2. The circuit of claim 1, wherein said current limit circuitry includes a comparator operable to compare said first and second reference voltages.

3. A current limiting circuit, comprising:

a plurality of current limit programmable cells operable to be programmed with a current limit, said programmable cells comprising electrically erasable programmable read only memory cells;

output circuitry operable to output current;

current limit circuitry coupled to said current limit programmable cells and said output circuitry, said current limit circuitry operable to limit said output current when said output current reaches said current limit;

an oscillator;

a counter coupled to said oscillator;

a plurality of on-time programmable cells operable to be programmed with an on-time;

a plurality of off-time programmable cells operable to be programmed with an off-time;

an on-time comparator coupled to said counter and said on-time programmable cells, said on-time comparator operable to turn off said output circuitry after reaching a current limit for said on-time; and an off-time comparator coupled to said counter and said off-time programmable cells, said off-time comparator operable to turn on said output circuitry after said off-time.

4. The circuit of claim 3, wherein said programmable cells comprise electrically erasable programmable read only memory cells.

5. The circuit of claim 3, and further comprising a plurality of frequency adjust programmable cells coupled to said oscillator, said frequency adjust programmable cells programmable with an oscillator frequency such that said oscillator oscillates at said frequency.

6. The circuit of claim 5, wherein said programmable cells comprise electrically erasable programmable read only memory cells.

7. A current limiting circuit, comprising:

a plurality of programmable cells operable to be programmed with a current limit;

a plurality of transistors, each of the transistors having a control electrode coupled to an associated one of the plurality of programmable cells, each of said transistors having a current path coupled in series with a resistor;

a comparator having first and second inputs and an output, the first input coupled to a node between the current paths of the transistors and the resistor for receiving a first reference voltage;

output circuitry for providing an output current, the output circuitry providing a second reference voltage at the second input of the comparator, the comparator generating a control signal when the first and second reference voltages are substantially equal, the output circuitry responsive to the control signal for limiting the output current.

8. The circuit of claim 7 in which the programmable cells are electrically erasable programmable read only memory cells.

* * * * *